US009754851B2

(12) United States Patent
Auchere et al.

(10) Patent No.: US 9,754,851 B2
(45) Date of Patent: Sep. 5, 2017

(54) ELECTRONIC DEVICE PROVIDED WITH AN INTEGRATED CONDUCTOR ELEMENT AND FABRICATION METHOD

(71) Applicants: STMicroelectronics (Grenoble 2) SAS, Grenoble (FR); STMicroelectronics (Alps) SAS, Grenoble (FR)

(72) Inventors: David Auchere, St. Martin d'Heres (FR); Laurent Marechal, Bures sur Yvette (FR); Yvon Imbs, Quaix en Chartreuse (FR); Laurent Schwarz, La Buisse (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 15/050,253

(22) Filed: Feb. 22, 2016

(65) Prior Publication Data

US 2017/0062299 A1    Mar. 2, 2017

(30) Foreign Application Priority Data

Aug. 28, 2015   (FR) ...................................... 1557999

(51) Int. Cl.
*H01L 23/48*   (2006.01)
*H01L 23/31*   (2006.01)
(Continued)

(52) U.S. Cl.
CPC ...... *H01L 23/3121* (2013.01); *H01L 21/3105* (2013.01); *H01L 21/4853* (2013.01);
(Continued)

(58) Field of Classification Search
CPC .... H01L 23/3121; H01L 23/315; H01L 23/66
(Continued)

(56) References Cited

U.S. PATENT DOCUMENTS

2004/0217472 A1   11/2004   Aisenbrey et al.
2005/0285794 A1   12/2005   Tang et al.
(Continued)

FOREIGN PATENT DOCUMENTS

FR            2780551 A1    12/1999
WO    WO-2010057808 A1     5/2010

OTHER PUBLICATIONS

INPI Search Report and Written Opinion for FR 1557999 dated Jul. 8, 2016 (10 pages).

*Primary Examiner* — Anthony Ho
(74) *Attorney, Agent, or Firm* — Gardere Wynne Sewell LLP

(57) ABSTRACT

An electronic device includes a support plate having a mounting face and an electrical connection network. An integrated circuit chip is mounted on the mounting face and linked to the electrical connection network. An en encapsulation block embeds the integrated circuit chip. An additional element made of an electrically conductive material is at least partly embedded within the encapsulation block. The additional conductive element has a main portion extending parallel to the support plate and has a secondary portion that is linked electrically to the integrated circuit chip. An opening is formed in the encapsulation block, and the secondary portion extends into that opening to make the electrical link. The additional conductive element may be an antenna.

37 Claims, 4 Drawing Sheets

(51) Int. Cl.
  *H01L 21/56* (2006.01)
  *H01L 23/66* (2006.01)
  *H01Q 1/22* (2006.01)
  *H01L 21/3105* (2006.01)
  *H01L 21/48* (2006.01)
  *H01L 23/498* (2006.01)

(52) U.S. Cl.
  CPC ............ *H01L 21/56* (2013.01); *H01L 23/315* (2013.01); *H01L 23/3135* (2013.01); *H01L 23/49838* (2013.01); *H01L 23/66* (2013.01); *H01Q 1/2283* (2013.01); *H01L 2223/6677* (2013.01); *H01L 2224/16227* (2013.01); *H01L 2924/15311* (2013.01); *H01L 2924/1815* (2013.01)

(58) Field of Classification Search
  USPC ....................................................... 257/773
  See application file for complete search history.

(56) References Cited

U.S. PATENT DOCUMENTS

| | | |
|---|---|---|
| 2008/0184550 A1 | 8/2008 | Hwan et al. |
| 2009/0289343 A1 | 11/2009 | Chiu et al. |
| 2011/0049686 A1 | 3/2011 | Yun et al. |
| 2012/0062439 A1 | 3/2012 | Liao et al. |
| 2013/0009320 A1 | 1/2013 | Yoo et al. |
| 2013/0087895 A1 | 4/2013 | Upadhyayula et al. |
| 2015/0102500 A1 | 4/2015 | Coffy et al. |

ELECTRONIC DEVICE PROVIDED WITH AN INTEGRATED CONDUCTOR ELEMENT AND FABRICATION METHOD

PRIORITY CLAIM

This application claims priority from French Application for Patent No. 1557999 filed Aug. 28, 2015, the disclosure of which is incorporated by reference.

TECHNICAL FIELD

The present invention relates to the field of electronic devices.

BACKGROUND

Known electronic devices, generally of parallelepipedal form, comprise a support plate, including an electrical connection network, an integrated circuit chip mounted on one of the faces of the support plate and an encapsulation block in which the chip is embedded. The chip is linked to the network of the support plate by electrical connection elements such as balls, interposed between the support plate and the chip, or by electrical connection wires embedded in the encapsulation block.

Such electronic devices are mounted on printed circuit plates, generally via electrical connection elements such as balls, linking the electrical connection network of the support plates and the electrical connection network of the printed circuit plates.

When the chips generate radiofrequency signals that have to be transmitted or process received radiofrequency signals, the transmission or reception antennas are produced on the printed circuit plates. The electrical signals follow very long resistive paths which are formed by lines of the electrical connection network of the printed circuit plates, the electrical connection elements between the printed circuit plates and the support plates, lines of the electrical connection network of the support plates and the electrical connection elements between the support plates. Such paths further depend on the quality of the interconnections obtained from the fabrication.

The above provisions constitute a handicap notably when the necessary dimension of the antennas, for the transmission of radiofrequency signals at frequencies of the order of a gigahertz or above, even very much greater than a gigahertz, become reduced.

SUMMARY

According to one embodiment, an electronic device is proposed that comprises a support plate having a mounting face and including an electrical connection network, at least one integrated circuit chip, mounted on said mounting face of the support plate and linked to said electrical connection network, an encapsulation block in which the chip is embedded, this encapsulation block extending over the chip and around the latter on said mounting face of the support plate, and at least one additional element made of an electrically conductive material, at least partly embedded in said encapsulation block, this additional conductive element having at least one main portion extending parallel to said support plate and having at least one secondary portion linked electrically to said chip.

Said secondary portion of the additional conductive element can be linked to at least one electrical contact formed on said mounting face of said support plate at a distance from the periphery of the chip.

Said secondary portion of the additional conductive element can be linked to at least one electrical contact formed on a front face of said chip.

Said secondary portion of said additional conductive element can be folded back towards the support plate relative to its main portion.

A soldering material can be interposed between said secondary portion of said additional conductive element and said electrical contact of the support plate.

Said encapsulation block can have a cavity at least partially revealing said main portion of said additional conductive element.

Said main portion of said additional conductive element can extend over and at a distance from the chip.

Said additional conductive element can constitute a radiofrequency antenna.

Said encapsulation block can comprise two superposed parts between which said additional conductive element extends.

A method for fabricating an electronic device is also proposed, in which there is available a primary electronic device comprising a support plate, an integrated circuit chip mounted on a mounting face of the support plate and a primary encapsulation block extending over the chip and around the chip on said mounting face of the support plate, the encapsulation block having a front face parallel to the support plate; and an additional element made of an electrically conductive material, formed so as to have at least one main portion and at least one secondary portion.

The method comprises: producing a hole through said primary encapsulation block of the primary electronic device, from its front face, to at least partially reveal an electrical contact of said mounting face of said support plate or of the chip; installing said additional conductive element in a position such that its main portion extends over said front face of the primary encapsulation block and its secondary portion is linked to said electrical contact in said hole; and producing an additional encapsulation block on said primary encapsulation block of said primary electronic device, the primary encapsulation block and the additional block constituting a final encapsulation block in which said additional conductive element is at least partially embedded.

The method can comprise: having available an additional conductive element having a secondary portion folded back relative to its main portion and installing the additional conductive element in a position such that this secondary portion is engaged in said hole of the encapsulation block of the primary electronic device.

The method can comprise: linking the secondary portion of said additional conductive element to said electrical contact by soldering material.

The method can comprise: producing a groove in the front face of the primary encapsulation block of the primary electronic device and installing at least said main part of said additional conductive element in this groove.

The method can comprise: at least partly bonding said additional conductive element on the front face of the primary encapsulation block of the primary electronic device.

The method can comprise: producing a void in the additional encapsulation block, so as to partially reveal said main part of said additional conductive element.

The method can comprise: before installing said additional conductive element, producing a void in said primary encapsulation block of the primary electronic device and installing said additional conductive element in a position such that said main portion of this additional conductive element totally covers and closes this void.

BRIEF DESCRIPTION OF THE DRAWINGS

Electronic devices and their fabrication methods will now be described as exemplary embodiments, illustrated by the drawing in which.

DETAILED DESCRIPTION

Figure 1:
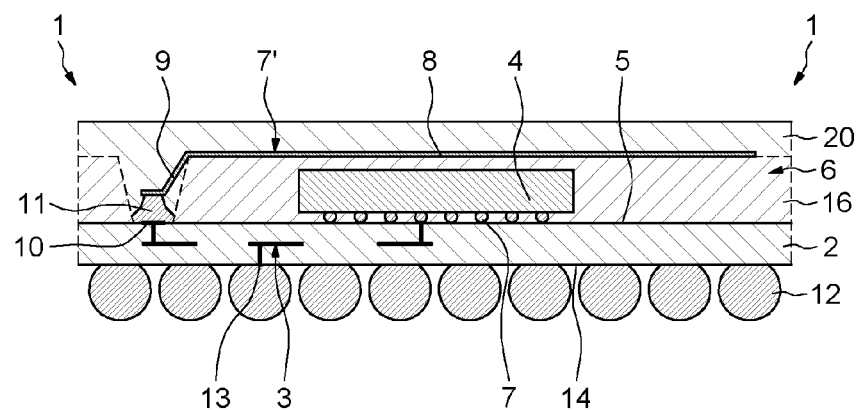
FIG. 1 represents a cross section of an electronic device.
Figure 2:
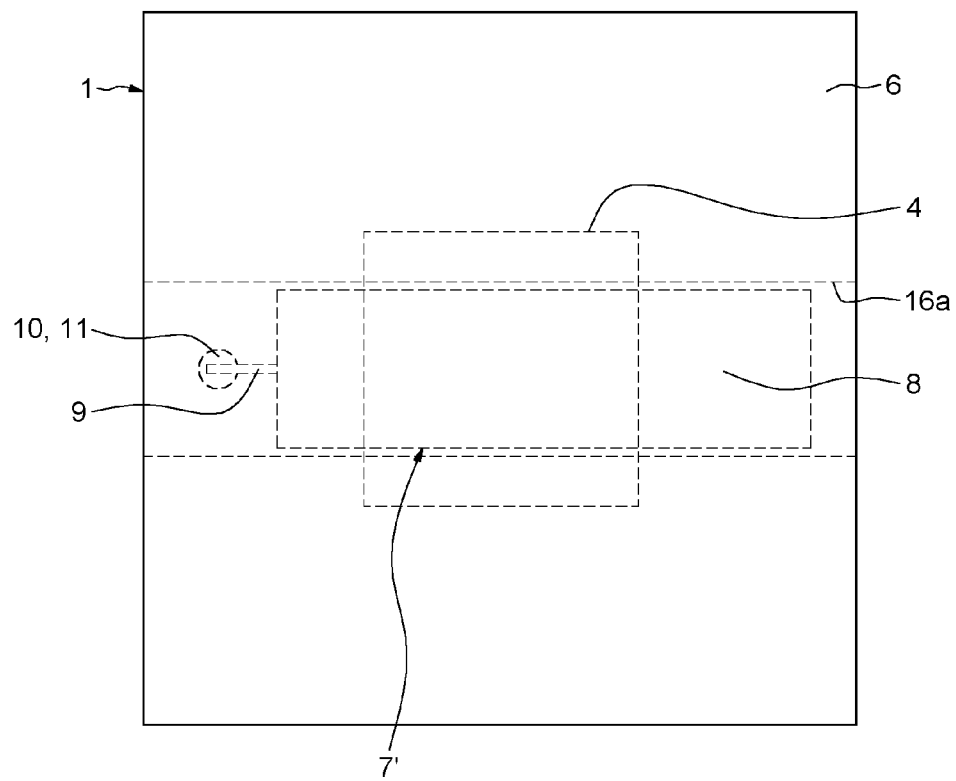
FIG. 2 represents a plan view of the electronic device of FIG. 1.

As illustrated in FIGS. 1 and 2, according to an exemplary embodiment, a final electronic device 1 comprises a support plate 2, including an integrated electrical connection network 3, an integrated circuit chip 4 mounted on a front mounting face 5 of the support plate 2 and a final encapsulation block 6 in which the chip 4 is embedded and which extends over the chip 4 and around the latter, on the mounting face 5 of the support plate 2, such that the electronic device 1 takes the form of a parallelepiped.

According to a variant embodiment represented, the integrated circuit chip 4 is mounted on the mounting face 5 of the support plate 2 via electrical connection elements 7, such as balls, which selectively link the chip 4 and the electrical connection network 3. According to another variant embodiment, the chip 4 could be bonded onto the mounting face 5 of the support plate 2 and be linked to the electrical connection network 3 by electrical connection wires embedded in the encapsulation block 6.

The electronic device 1 further comprises an additional integrated element 7' made of an electrically conductive material, preferably rigid, embedded in the encapsulation block 6.

The additional conductive element 7' comprises a main portion 8 which extends parallel to the mounting face 5 of the support plate 2 and a secondary portion 9 which links the main portion 8 to an electrical contact 10 of the electrical connection network 3 via a soldering material 11, this electrical contact 10 being formed on the mounting face 5 of the support plate 2 and being situated at a distance from and outside the periphery of the chip 4 and at a distance from and inside the periphery of the encapsulation block 6.

According to a variant embodiment represented, the main portion 8 of the additional conductive element 7' extends over and at a distance from the chip 4 and the secondary portion 9 is folded back towards the support plate 2 relative to the main portion 8.

The additional conductive element 7', prefabricated, can for example be formed by stamping an elongate metal sheet of which the main portion 8 is flat above and at a distance from the support plate 2 and the chip 4, a secondary portion 9 being able to be reduced to a folded-back tab. The additional conductive element 7' can be obtained by cutting a metal plate and forming at the same time or after the cutting.

The electronic device 1 can be provided with external electrical connection elements 12, such as balls, arranged on electrical contacts 13 of the electrical connection network 3 formed on a face 14 of the support plate 2, opposite the mounting face 5, these electrical contacts 13 being linked selectively to the electrical connection network 3 of the support plate 2.

The electronic device 1 can be produced as follows.

Figure 3:
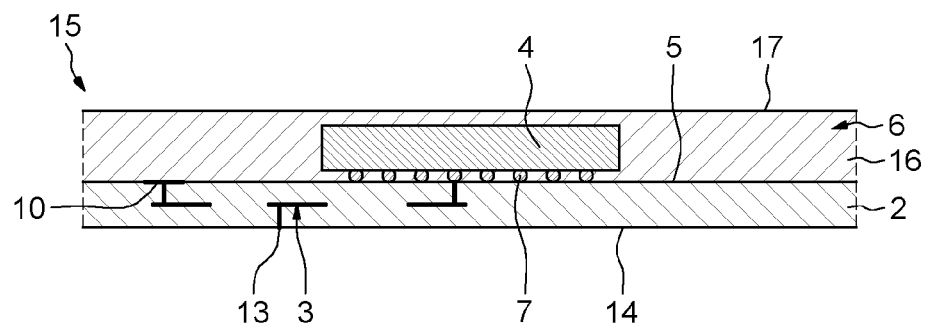
FIG. 3 represents a step of fabrication, in cross section, of the electronic device of FIG. 1.

As illustrated in FIG. 3, there is a primary electronic device 15 available, prefabricated, which comprises the support plate 2, the chip 4 mounted as described previously and a primary encapsulation block 16 in which the chip 4 is embedded and which extends, around the chip 4, over the mounting face 5 of the support plate 2. The primary encapsulation block 16 has a front face 17 which is parallel to the support plate 2 and which extends over and at a distance from the chip 4.

Figure 4:
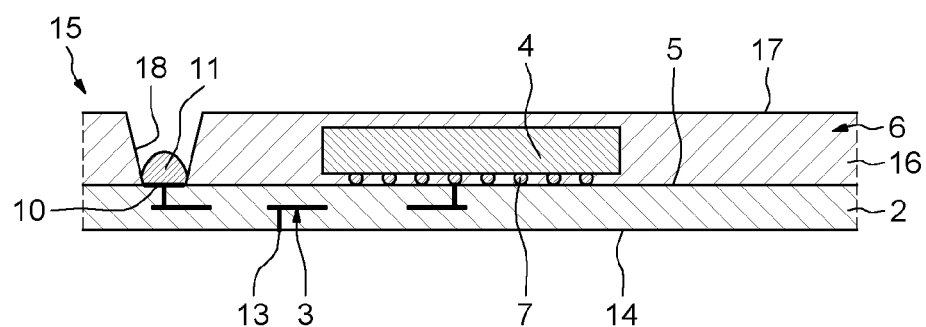
FIG. 4 represents another step of fabrication, in cross section, of the electronic device of FIG. 1.

As illustrated in FIG. 4, a hole 18 is produced locally through the primary encapsulation block 16, from its front face 17, at a point situated between the periphery of the chip 4 and the periphery of the primary encapsulation block 16, so as to reveal the electrical contact 10. Then, a drop of a soldering material 11 is deposited at the bottom of the hole 18 on the electrical contact 10.

Figure 5:
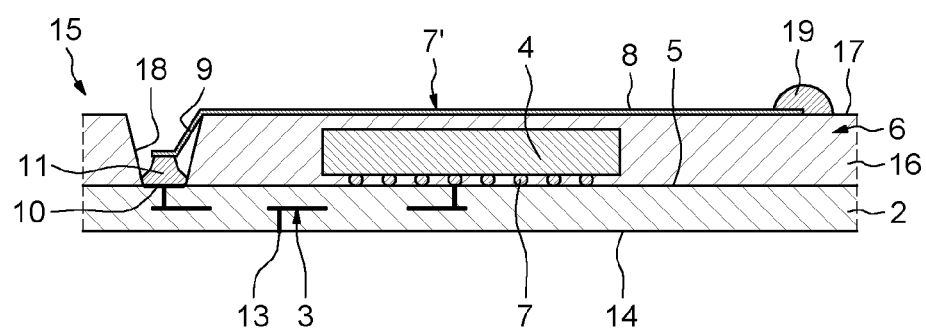
FIG. 5 represents another step of fabrication, in cross section, of the electronic device of FIG. 1.

Next, as illustrated in FIG. 5, the additional conductive element 7', prefabricated by forming and cutting, is installed on the primary encapsulation block 16, in a position such that its primary portion 8 extends over the front face 17 and its secondary portion 9 is engaged in the hole 18, the end of the secondary portion coming into contact on the soldering material 11.

Then, optionally, at least the part of the main portion 8 furthest away from the secondary portion 9, for example, is bonded onto the front face 17 using a spot of glue 19. According to a variant embodiment, illustrated optionally in FIG. 2, a positioning groove 16a emerging in the hole 18 could be produced in the front face 17 of the primary encapsulation block 16, the main portion 8 of the additional conductive element 7 being able to be inserted into this groove 16a and thus positioned and held in place.

Next, the electrical device 15 is passed into an oven to produce the soldering of the secondary portion 9 of the additional conductive element 7' on the electrical contact 10 via the soldering material 11, the additional conductive element 7' being held by virtue of the spot of glue 19.

Figure 6:
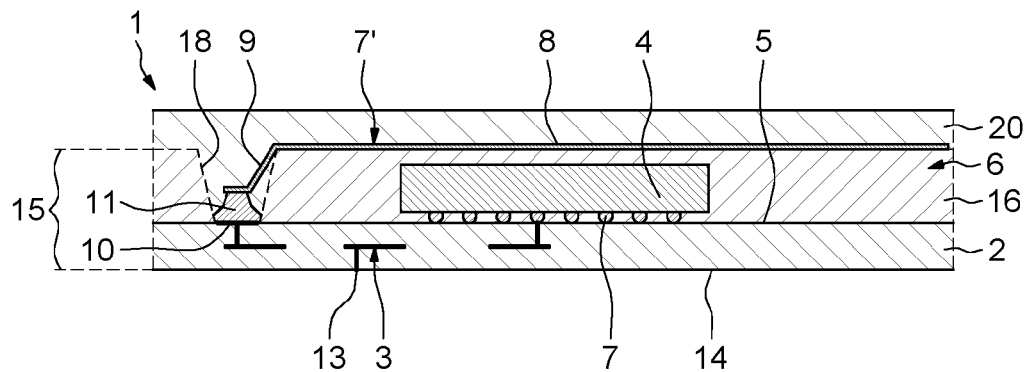
FIG. 6 represents another step of fabrication, in cross section, of the electronic device of FIG. 1.

Next, as illustrated in FIG. 6, an additional encapsulation block 20 is produced on the primary encapsulation block 16 so as to cover the additional conductive element 7', such that the primary encapsulation block 16 and the additional encapsulation block 20 constitute the final encapsulation block 6 and that the final electronic device 1 is obtained as described previously with reference to FIGS. 1 and 2.

Figure 7:
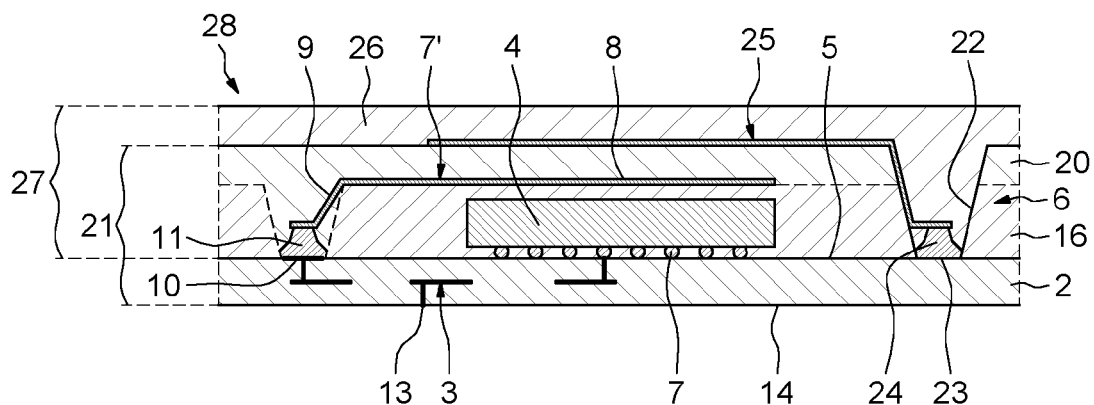
FIG. 7 represents a cross section of another electronic device.

As illustrated in FIG. 7, according to another exemplary embodiment, the final electronic device 1 can be considered as a new primary electronic device 21, on which steps equivalent to the steps described above with reference to FIGS. 4 to 6 are carried out, for example as follows.

A hole 22 is produced in or through the encapsulation block 6 from its front face 6a, at a point different from that of the previous hole 18, so as to reveal another electrical contact 23 of the electrical connection network 3, this other electrical contact 23 being formed on the mounting face 5 of the support plate 2.

Then, a drop of a soldering material 24 is deposited on this electrical contact 23 at the bottom of the hole 22.

Next, another additional conductive element 25, equivalent to the additional conductive element 7, is installed, with a main portion placed on the front face 6a of the encapsulation block 6 and a secondary part engaged in the hole 22 to be placed on the drop 24. Then, the soldering is done.

Finally, another additional encapsulation block 26 is produced on the encapsulation block 6, covering the other additional conductive element 25, so as to form another final encapsulation block 27 consisting of the encapsulation block 6 and of the additional encapsulation block 26.

A final electronic device 28 is then obtained that is equipped with the two additional conductive elements 7' and 25, embedded in this final encapsulation block 27.

Figure 8:
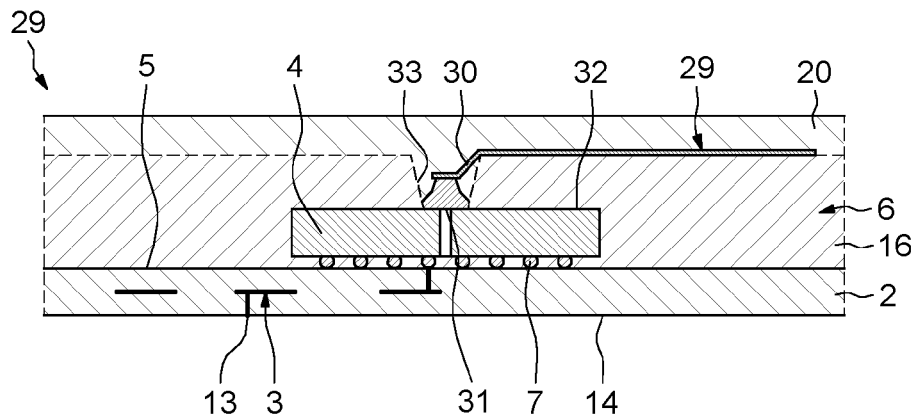
FIG. 8 represents a cross section of another electronic device.

As illustrated in FIG. 8, according to another exemplary embodiment, a final electronic device 28 is differentiated from the electronic device 1 described previously by the fact that it comprises an additional conductive element 29 of which the secondary portion 30 is, this time, directly linked to a specific electrical contact 31 provided on the front face 32 of the chip 4. The specific electrical contact 31 can result from the formation of an electrical link passing through the substrate from the integrated circuit chip 4, known by the name TSV (Through Silicon Via).

In this exemplary embodiment, the fabrication step, equivalent to that described with reference to FIG. 4, consists in producing a hole 33 through the primary encapsulation block 16, at a point situated over the chip 4, so as to reveal the electrical contact 31. The subsequent steps of installation of an additional conductive element 7 and of production of an additional encapsulation block 20 are equivalent to those described with reference to FIGS. 5 and 6.

Figure 9:
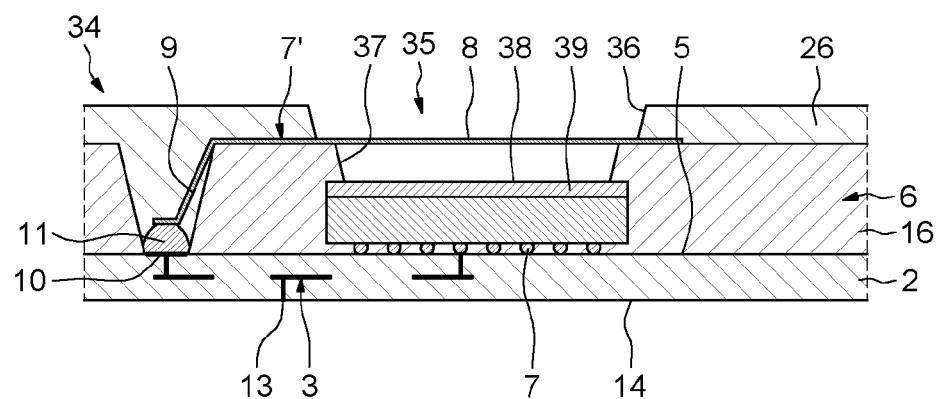
FIG. 9 represents a cross section of another electronic device.
Figure 10:
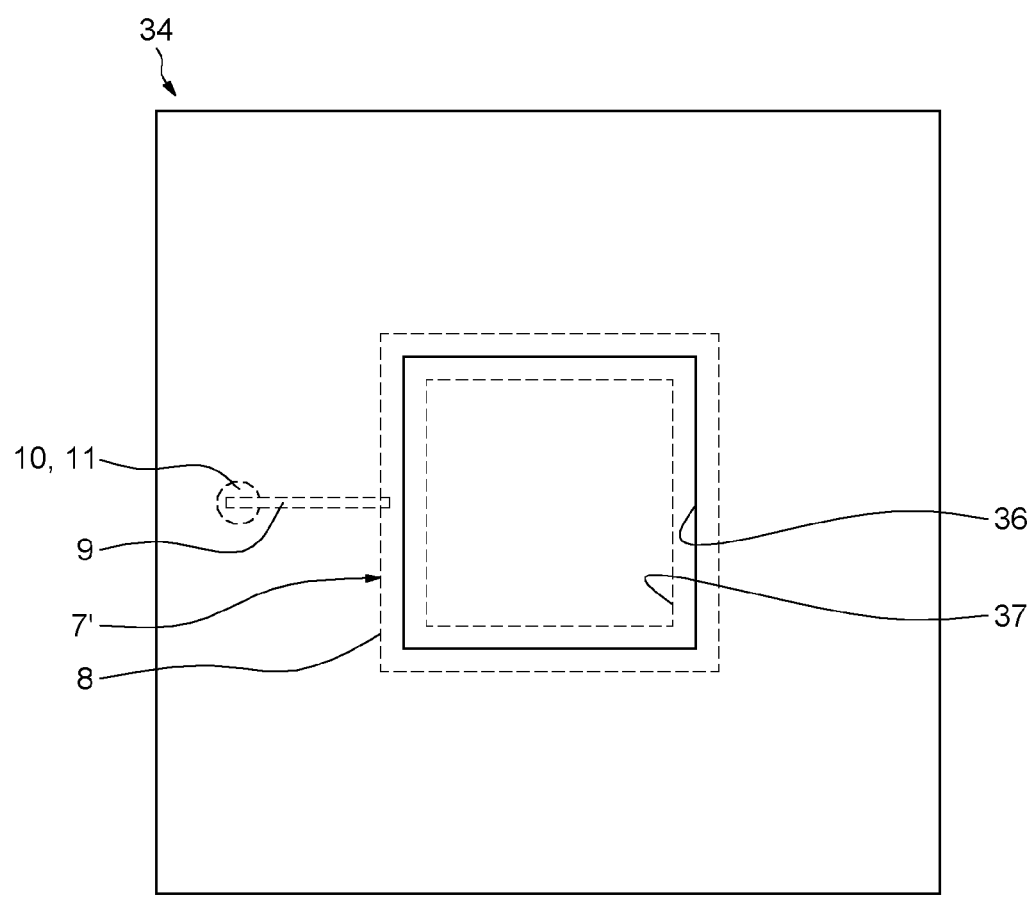
FIG. 10 represents a plan view of the electronic device of FIG. 9.

As illustrated in FIGS. 9 and 10, according to another exemplary embodiment, a final electronic device 34 is differentiated from the electronic device 1 described previously by the fact that it comprises a formation of a cavity 35 in a final encapsulation block 6, open outwards and partially revealing the main portion 8 of the additional conductive element 7'.

The cavity 35 comprises an opening 36 formed through the additional encapsulation block 20, to the main portion 8 of the additional conductive element 7'. This opening 36 is produced after the step of production of the additional encapsulation block 20.

The cavity 35 further comprises a void 37 formed under the main portion 8 of the additional conductive element 7', for example between the front face 38 of the chip 4 opposite the support plate 2 and this main portion 8.

The void 37 is produced in the step described with reference to FIG. 4, before the placement of the additional conductive element 7'. The main portion 8 of the additional conductive element 7' completely covers the void 37 so that, during the step of production of the additional encapsulation block 20, the material forming this block 26 does not penetrate into this void 37.

Moreover, the front face 38 of the chip 4 can be covered by a metallic layer 39. The main portion 8 of the additional conductive element 7' can serve to form a radiofrequency antenna and the metallic layer 39 can in this case serve as ground plane for said antenna.

According to a variant embodiment, the main portion 8 of the additional conductive element 7' could be perforated.

A cavity equivalent to the cavity 35 could be produced in the electronic devices described with reference to FIGS. 7 and 8.

In the case where the main portion 8 of the additional conductive element 7' forms a radiofrequency antenna, the cavity 35 and the void 37 formed under the main portion 8 of the additional conductive element 7' offer the advantage of making it possible to access the main portion 8 to deform it and/or perforate it, in order to adjust the electromagnetic characteristics of the antenna. This adjustment operation can be performed after the fabrication of the final device 34 is finished and the latter has been mounted and tested in the desired application.

The electronic devices which have just been described can be obtained by a collective fabrication on a common support wafer, as is known in the microelectronics field. The encapsulation blocks and the additional encapsulation blocks can be obtained by spreading a liquid material, for example an epoxy resin, then by hardening this material.

Of course, the additional conductive elements of the electronic devices can take any desired topographic forms.

The additional conductive elements of the electronic devices which have just been described, included in the final encapsulation block, can advantageously constitute electromagnetic antennas for the transmission/reception of radiofrequency signals at very high frequencies (up to a gigahertz or above a gigahertz, even several hundred gigahertz), linked to the chip 4 by short electrical connection paths, via the electrical connection network of the support plate 2 (FIG. 1) or directly (FIG. 8).

The invention claimed is:

1. An electronic device, comprising:
   a support plate having a mounting face and including an electrical connection network;
   an integrated circuit chip mounted on said mounting face of the support plate and linked to said electrical connection network;
   an encapsulation block embedding the integrated circuit chip, said encapsulation block extending over the integrated circuit chip and around the integrated circuit chip on said mounting face of the support plate, the encapsulation block having a through hole exposing an electrical contact; and
   a conductive element made of an electrically conductive material and at least partly carried by in said encapsulation block, said conductive element having a main portion extending parallel to said support plate and having a secondary portion folded back towards the support plate relative to said main portion and extending into the through hole of the encapsulation block and linked electrically to said electrical contact.

2. The device according to claim 1, wherein said through hole exposes said mounting face of said support place and said electrical contact is formed on said mounting face of said support plate at a distance from a periphery of the integrated circuit chip.

3. The device according to claim 1, wherein said through hole exposes a front face of said integrated circuit chip and said electrical contact is formed on said front face of said integrated circuit chip.

4. The device according to claim 1, wherein a soldering material is interposed between said secondary portion of said conductive element and said electrical contact.

5. The device according to claim 1, wherein the encapsulation block includes a cavity at least partially revealing said main portion of said conductive element.

6. The device according to claim 1, wherein said main portion of said conductive element extends over and at a distance from the integrated circuit chip.

7. The device according to claim 1, wherein said conductive element is a radiofrequency antenna.

8. The device according to claim 1, further including an additional encapsulation block extending over said encapsulation block, wherein material of said additional encapsulation block fills said through hole, and wherein said conductive element extends between said encapsulation block and said additional encapsulation block.

9. The device according to claim 1, wherein said encapsulation block includes a groove and the main portion of said conductive element extends within said groove.

10. An electronic device, comprising:
a primary electronic device comprising a support plate and an integrated circuit chip mounted on a mounting face of the support plate;
a primary encapsulation block in contact with and encapsulating said primary electronic device, the primary encapsulation block having a front face parallel to the support plate;
wherein the primary encapsulation block includes a hole extending into the primary encapsulation block from said front face to reach an electrical contact;
a conductive element positioned such that a main portion of the conductive element extends over the front face of the primary encapsulation block and a secondary portion of the conductive element extends into said hole and is electrically connected to said electrical contact; and
an additional encapsulation block in contact with the primary encapsulation block and wherein material of said additional encapsulation block fills said hole and encapsulates around the secondary portion of the conductive element.

11. The device of claim 10, wherein said electrical contact is located on said mounting face of said support plate.

12. The device of claim 10, wherein said electrical contact is located on a face of the integrated circuit chip.

13. The device of claim 10, wherein said secondary portion is folded back relative to said main portion.

14. The device of claim 10, further comprising a solder material for electrically connecting the conductive element to said electrical contact.

15. The device of claim 10, wherein the front face of the primary encapsulation block includes a groove, and wherein said main portion of said conductive element in located in said groove.

16. The device of claim 10, wherein said conductive element is bonded on the front face of the primary encapsulation block.

17. The device of claim 10, wherein the additional encapsulation block includes a void that at least partially reveals said main portion of said conductive element.

18. An electronic device, comprising:
a support plate having a mounting face with an electrical contact and including an electrical connection network connected to said electrical contact;
an integrated circuit chip having a first face mounted on said mounting face of the support plate and linked to said electrical connection network;
an encapsulation block embedding the integrated circuit chip, said encapsulation block extending over the integrated circuit chip and around the integrated circuit chip on said mounting face of the support plate, the encapsulation block having a through hole exposing the electrical contact at the mounting face of the support plate;
a conductive element made of an electrically conductive material and at least partly carried by said encapsulation block, said conductive element having a main portion extending parallel to said support plate and having a secondary portion extending into said through hole; and
a soldering material interposed between said secondary portion of said conductive element and said electrical contact.

19. The device according to claim 18, wherein the encapsulation block includes a cavity at least partially revealing said main portion of said conductive element.

20. The device according to claim 18, wherein said main portion of said conductive element extends over and at a distance from the integrated circuit chip.

21. The device according to claim 18, wherein said conductive element is a radiofrequency antenna.

22. The device according to claim 18, further including an additional encapsulation block extending over said encapsulation block, wherein material of said additional encapsulation block fills said through hole, and wherein said conductive element extends between said encapsulation block and said additional encapsulation block.

23. The device according to claim 18, wherein said encapsulation block includes a groove and the main portion of said conductive element extends within said groove.

24. An electronic device, comprising:
a support plate having a mounting face and including an electrical connection network;
an integrated circuit chip having a first face mounted on said mounting face of the support plate and linked to said electrical connection network and a second face with an electrical contact;
an encapsulation block embedding the integrated circuit chip, said encapsulation block extending over the integrated circuit chip and around the integrated circuit chip on said mounting face of the support plate, the encapsulation block having a through hole exposing the electrical contact at the second face of the integrated circuit chip;
a conductive element made of an electrically conductive material and at least partly carried by said encapsulation block, said conductive element having a main portion extending parallel to said support plate and having a secondary portion extending into said through hole; and
a soldering material interposed between said secondary portion of said conductive element and said electrical contact.

25. The device according to claim 24, wherein the encapsulation block includes a cavity at least partially reveals said main portion of said conductive element.

26. The device according to claim 24, wherein said main portion of said conductive element extends over and at a distance from the integrated circuit chip.

27. The device according to claim 24, wherein said conductive element is a radiofrequency antenna.

28. The device according to claim 24, further including an additional encapsulation block extending over said encapsulation block, wherein material of said additional encapsulation block fills said through hole, and wherein said conductive element extends between said encapsulation block and said additional encapsulation block.

29. The device according to claim 24, wherein said encapsulation block includes a groove and the main portion of said conductive element extends within said groove.

30. An electronic device, comprising:
a support plate having a mounting face and including an electrical connection network;
an integrated circuit chip mounted on said mounting face of the support plate and linked to said electrical connection network;
an encapsulation block embedding the integrated circuit chip, said encapsulation block extending over the integrated circuit chip and around the integrated circuit chip on said mounting face of the support plate, the encapsulation block having a through hole exposing part of the mounting face of the support plate; and
a conductive element made of an electrically conductive material and at least partly embedded in said encapsulation block, said conductive element having a main portion extending parallel to said support plate and having a secondary portion extending into the through hole of the encapsulation block and linked electrically to said integrated circuit chip.

31. The device according to claim 30, wherein said secondary portion of the conductive element is linked to an electrical contact exposed by said through hole and formed on said mounting face of said support plate at a distance from a periphery of the integrated circuit chip.

32. The device according to claim 30, wherein said secondary portion of said conductive element is folded back towards the support plate relative to said main portion.

33. The device according to claim 30, wherein the encapsulation block includes a cavity at least partially revealing said main portion of said conductive element.

34. The device according to claim 30, wherein said main portion of said conductive element extends over and at a distance from the integrated circuit chip.

35. The device according to claim 30, wherein said conductive element is a radiofrequency antenna.

36. The device according to claim 30, wherein said encapsulation block comprises two superposed parts between which said conductive element extends.

37. The device according to claim 30, wherein said encapsulation block includes a groove and the main portion of said conductive element extends within said groove.

* * * * *

UNITED STATES PATENT AND TRADEMARK OFFICE
CERTIFICATE OF CORRECTION

PATENT NO.        : 9,754,851 B2
APPLICATION NO.   : 15/050253
DATED             : September 5, 2017
INVENTOR(S)       : David Auchere et al.

It is certified that error appears in the above-identified patent and that said Letters Patent is hereby corrected as shown below:

In the Claims

At Column 6, Claim number 1, Line number 49, please replace the phrase [[by in said]] with the correct phrase -- by said --.

Signed and Sealed this
Seventh Day of November, 2017

Joseph Matal
*Performing the Functions and Duties of the
Under Secretary of Commerce for Intellectual Property and
Director of the United States Patent and Trademark Office*